United States Patent
Ito

(10) Patent No.: US 10,743,416 B2
(45) Date of Patent: Aug. 11, 2020

(54) CIRCUIT MODULE

(71) Applicant: Murata Manufacturing Co., Ltd., Nagaokakyo-shi, Kyoto-fu (JP)

(72) Inventor: Takanori Ito, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 21 days.

(21) Appl. No.: 16/264,988

(22) Filed: Feb. 1, 2019

(65) Prior Publication Data

US 2019/0166694 A1 May 30, 2019

Related U.S. Application Data

(63) Continuation of application No. PCT/JP2017/029312, filed on Aug. 14, 2017.

(30) Foreign Application Priority Data

Aug. 24, 2016 (JP) .................................. 2016-164165

(51) Int. Cl.
  *H05K 1/18* (2006.01)
  *H01L 25/00* (2006.01)
  (Continued)

(52) U.S. Cl.
  CPC .............. *H05K 1/185* (2013.01); *H01L 25/00* (2013.01); *H03H 9/64* (2013.01); *H03H 7/0115* (2013.01); *H03H 9/0542* (2013.01); *H03H 9/0552* (2013.01); *H03H 9/0566* (2013.01); *H03H 9/725* (2013.01); *H05K 1/18* (2013.01);
  (Continued)

(58) Field of Classification Search
  CPC .......... H05K 1/185; H05K 1/18; H01L 25/00; H03H 9/64; H03H 9/0542; H03H 9/0552; H03H 9/0566; H03H 9/725; H03H 7/0115
  See application file for complete search history.

(56) References Cited

U.S. PATENT DOCUMENTS

| 6,373,714 B1 | 4/2002 | Kudoh et al. |
| 2011/0182039 A1 | 7/2011 | Kato et al. |

FOREIGN PATENT DOCUMENTS

| JP | 62-208616 A | 9/1987 |
| JP | 09-27438 A | 1/1997 |

(Continued)

OTHER PUBLICATIONS

Official Communication issued in International Patent Application No. PCT/JP2017/029312, dated Oct. 24, 2017.

*Primary Examiner* — Samuel S Outten
(74) *Attorney, Agent, or Firm* — Keating & Bennett, LLP

(57) ABSTRACT

A circuit module includes a substrate on first and second surfaces of which electronic components are mounted, sealing resins with which at least the electronic components are sealed on the first and second surfaces of the substrate, and a terminal-use circuit component at both ends of which electrodes are provided, one of the electrodes being joined by a conductive joining member to one of the first and second surfaces of the substrate such that an axis connecting centers of the electrodes at the both ends is perpendicular or substantially perpendicular to the substrate and another of the electrodes is exposed at a surface of the sealing resin, and the terminal-use circuit component includes a void at which the conductive joining member is not disposed, at a center portion of the one of the electrodes on a side coupled to the substrate.

20 Claims, 11 Drawing Sheets

(51) Int. Cl.
*H03H 7/01* (2006.01)
*H03H 9/64* (2006.01)
H03H 9/05 (2006.01)
H03H 9/72 (2006.01)

(52) U.S. Cl.
CPC ............... *H05K 2201/1003* (2013.01); *H05K 2201/1006* (2013.01); *H05K 2201/10015* (2013.01); *H05K 2201/10022* (2013.01); *H05K 2201/10083* (2013.01); *H05K 2201/10545* (2013.01)

(56) References Cited

FOREIGN PATENT DOCUMENTS

| | | |
|---|---|---|
| JP | 2000-114686 A | 4/2000 |
| JP | 2008-177519 A | 7/2008 |
| JP | 2016-018928 A | 2/2016 |
| WO | 2010/041589 A1 | 4/2010 |

CIRCUIT MODULE

CROSS REFERENCE TO RELATED APPLICATIONS

This application claims the benefit of priority to Japanese Patent Application No. 2016-164165 filed on Aug. 24, 2016 and is a Continuation Application of PCT Application No. PCT/JP2017/029312 filed on Aug. 14, 2017. The entire contents of each of these applications are hereby incorporated herein by reference.

BACKGROUND OF THE INVENTION

1. Field of the Invention

The present invention relates to a circuit module.

2. Description of the Related Art

Heretofore, with regard to a circuit module mountable in an information communication terminal, such as a cellular phone or a personal digital assistant, there has been a demand for reducing the size of components and improving the mounting density of the components to deal with a broader frequency range and multiple bands. To satisfy this demand, in recent years, improvements have been made in the configuration in which components are mounted on both surfaces of a substrate and the layout of components (see, for example, Japanese Unexamined Patent Application Publication No. 2008-177519).

In the circuit module described in Japanese Unexamined Patent Application Publication No. 2008-177519, a chip electronic component is disposed such that the area occupied by the electronic component is small when viewed in plan view. Specifically, one of the electrodes provided at both ends of the chip electronic component is coupled to a substrate for mounting electronic components and the other of the electrodes is coupled to an external substrate.

However, in the circuit module according to the related art, the electrodes at the both ends of the electronic component are coupled to the respective substrates. With this configuration, in the circuit module according to the related art, while the electronic component is interposed between the substrates disposed on the both sides of the electronic component, the electrodes of the electronic component are joined to the substrates, and therefore, the electronic component is stably disposed in a direction perpendicular or substantially perpendicular to the circuit substrate. On the other hand, in the related art, it is difficult to stably dispose the electronic component in a direction perpendicular or substantially perpendicular to the circuit substrate without interposing the electronic component between the substrates, and as a result, there is a problem in which the operation of the circuit module is not stable and thus it is not possible to achieve higher performance.

SUMMARY OF THE INVENTION

Preferred embodiments of the present invention provide circuit modules the size of each of which is reduced and the performance of each of which is improved.

A circuit module according to a preferred embodiment of the present invention includes a substrate on first and second surfaces of which an electronic component is mounted, a sealing resin with which at least the electronic component is sealed on the first and second surfaces of the substrate, and a terminal-use circuit component defining a terminal at both ends of which electrodes are provided, one of the electrodes being joined by a conductive joining member to one of the first and second surfaces of the substrate such that an axis connecting centers of the electrodes at the first and second ends is perpendicular or substantially perpendicular to the substrate and another of the electrodes being exposed at a surface of the sealing resin, and the circuit component includes a void, where the conductive joining member is not disposed, at a center portion of the one of the electrodes on a side coupled to the substrate.

With this configuration, an electrode is not provided at the center portion of an end portion of the terminal-use circuit component, and thus the conductive joining member is not disposed at the center portion of the end portion of the terminal-use circuit component. Accordingly, because solder is uniformly spread over a portion other than the center portion of the end portion of the terminal-use circuit component and the terminal-use circuit component is coupled to the substrate, it is possible to reduce or prevent tilting of the terminal-use circuit component disposed with respect to the substrate. As a result, the terminal-use circuit component is stably disposed perpendicularly or substantially perpendicularly to the substrate, and thus it is unnecessary to support the terminal-use circuit component by a component other than the terminal-use circuit component, for example, substrates with which the terminal-use circuit component is supported. Accordingly, the electrode on the side of the terminal-use circuit component not coupled to the substrate is able to be stably coupled to a component that is externally disposed. In addition, since the terminal-use circuit component defines and functions as both an external connection terminal and an inductor, it is unnecessary to provide a space that is necessary for additionally disposing an inductor in the related art. Consequently, it is possible to reduce the size and improve the performance of the circuit module.

Furthermore, the electrode may be divided into a plurality of portions and disposed around the void.

With this configuration, the conductive joining members are disposed in center portions on the respective pieces of the divided electrode, and therefore, the terminal-use circuit component is able to be stably disposed perpendicularly or substantially perpendicularly to the substrate.

Moreover, the void may be a hollow portion provided in the center portion of the one of the electrodes joined to the one of the first and second surfaces of the substrate, and the substrate may include a protruding portion at a position facing the hollow portion.

With this configuration, the protruding portion protrudes into the hollow portion at a fixed angle, and therefore, the terminal-use circuit component is able to be stably disposed perpendicularly or substantially perpendicularly to the substrate.

Further, the hollow portion may be a through-hole passing through the both ends of the terminal-use circuit component, and the protruding portion may be a support rod that passes through the through-hole.

With this configuration, the length of the support rod and the length of the through-hole are longer respectively than the length of the protruding portion and the length of hollow portion, and therefore, the terminal-use circuit component is able to be stably disposed perpendicularly or substantially perpendicularly to the substrate.

Furthermore, a surface acoustic wave filter may be disposed on the substrate. The terminal-use circuit component may define and function as a first inductor provided between ground and a path on one side of an input side and an output side of the surface acoustic wave filter and a second inductor connected between ground and a resonator of the surface acoustic wave filter, the resonator being provided between ground and a path on another side of the input side and the output side of the surface acoustic wave filter and the first inductor and the second inductor may be disposed close to each other.

With this configuration, in the circuit module including the surface acoustic wave filter, the terminal-use circuit component is able to be stably disposed perpendicularly or substantially perpendicularly to the substrate. In addition, by using two terminal-use circuit components as inductors and disposing the two terminal-use circuit components close to each other, inductive coupling occurs between the circuit components and a coupling path different from the main path is able to be provided. In the circuit module, spurious waves that are outside the pass band and that flow in the main path are also routed into the coupling path and the rerouted signals are transformed, in the coupling path, to signals having a phase opposite to that of the spurious waves that are outside the pass band and that flow in the main path, and the spurious waves that are outside the pass band and that flow in the main path and the spurious waves that are outside the pass band and that flow in the coupling path cancel each other out in the circuit module. As a result, it is possible to improve the isolation characteristics.

Moreover, the circuit module may include a low pass filter, and the low pass filter may include a first capacitor, a third inductor one end of which is connected to one end of the first capacitor and another end of which is connected to another end of the first capacitor, a second capacitor connected between ground and a node between the one end of the first capacitor and the one end of the third inductor, and a third capacitor connected between ground and a node between the other end of the first capacitor and the other end of the third inductor.

With this configuration, in the circuit module having a function of a low pass filter, it is possible to reduce the size and improve the performance thereof.

Further, the third capacitor may be disposed between the electrodes at the first and second ends of the terminal-use circuit component, and the third inductor may include a coil wound around the third capacitor.

With this configuration, the inductor and the capacitor are able to be incorporated into one terminal-use circuit component, and therefore, it is possible to reduce the size of the circuit module.

Furthermore, the circuit module may include a high pass filter and the high pass filter may include a fourth capacitor and a fifth capacitor that are connected in series, and a fourth inductor connected between ground and a node between the fourth capacitor and the fifth capacitor.

With this configuration, in the circuit module having a function of a high pass filter, it is possible to reduce the size and improve the performance thereof.

Moreover, the low pass filter may be coupled to an antenna port that is coupled to an antenna to transmit and receive a low frequency signal.

With this configuration, it is possible to reduce or prevent harmonics at multiple bands at which signals are emitted from the antenna to transmit and receive a low frequency signal.

Further, the low pass filter may be coupled to an antenna port to which a transmit port to transmit signals at multiple frequencies is coupled.

With this configuration, in the circuit module using multiple frequency bands, it is possible to reduce the size and improve the performance of the circuit module.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
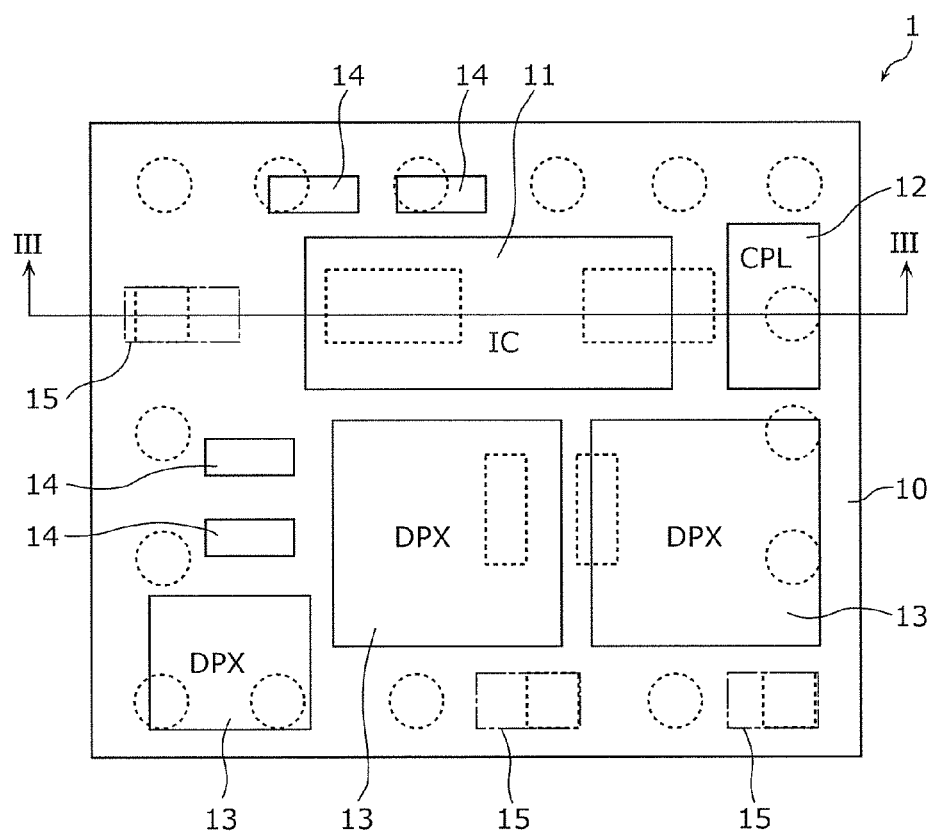
FIG. 1 is a conceptual diagram illustrating a configuration on one surface of a circuit module according to a Preferred Embodiment 1 of the present invention.

Hereinafter, preferred embodiments of the present invention will be described with reference to the accompanying drawings. It should be noted that the preferred embodiments described below are all preferred specific examples of the present invention. Consequently, the numerical values, the shapes, the materials, the elements, the arrangement and the structure of connection of the elements, and other structures and features provided in the following preferred embodiments are merely examples and are not intended to limit the present invention. Furthermore, among the elements in the following preferred embodiments, elements not recited in any of the independent claims indicating the most generic concept of the present invention are described as optional elements.

In addition, the drawings are schematic drawings and are not always depicted in an exact manner.

The same reference symbols are used to denote the same or substantially the same configurations in the drawings, and redundant descriptions thereof are omitted or simplified.

Preferred Embodiment 1

Hereinafter, a preferred embodiment of the present invention is described with reference to FIGS. 1 to 4B.

Figure 2:
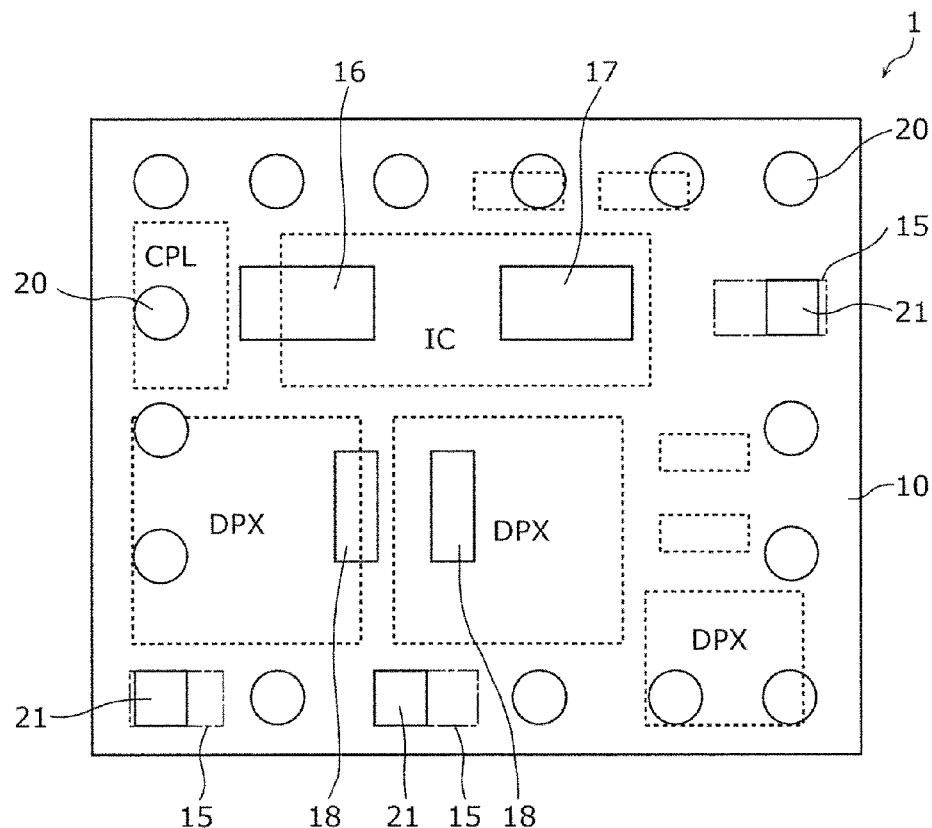
FIG. 2 is a conceptual diagram illustrating a configuration on the other surface of the circuit module according to the Preferred Embodiment 1 of the present invention.
Figure 3:
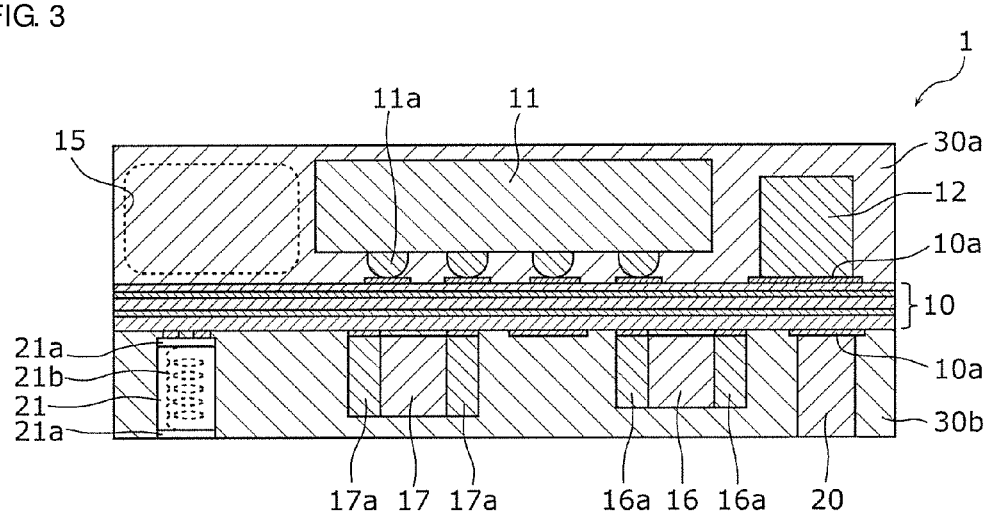
FIG. 3 illustrates a sectional view of a configuration of the circuit module according to the Preferred Embodiment 1 of the present invention taken along a line III-III illustrated in FIG. 1.

First, a configuration of a circuit module 1 according to the present preferred embodiment is described. FIG. 1 is a conceptual diagram illustrating a configuration on one surface of the circuit module 1 according to the present preferred embodiment. FIG. 2 is a conceptual diagram illustrating a configuration on the other surface of the circuit module 1 according to the present preferred embodiment. FIG. 3 illustrates a sectional view of a configuration of the circuit module 1 according to the present preferred embodiment taken along a line illustrated in FIG. 1.

The circuit module 1 according to the present preferred embodiment includes electronic components and other elements that are disposed on both surfaces of a substrate 10 and the surfaces are sealed with a sealing resin. The circuit module 1 is preferably, for example, a multi-band front-end circuit.

As illustrated in FIG. 1, an IC (Integrated Circuit) chip 11, a coupler (CPL) 12, duplexers (DPX) 13, and chip components 14 are disposed on the one surface of the circuit module 1. In addition, as illustrated in FIG. 2, chip components 16, 17, and 18, connection terminals 20, and terminal-use circuit components 21 are disposed on the other surface of the circuit module 1.

The substrate 10 is preferably, for example, a multilayer substrate and defined by a LTCC (Low Temperature Co-Fired Ceramics) substrate.

Specifically, the substrate 10 is a ceramic multilayer substrate in which a plurality of ceramic green sheets are laminated. The ceramic green sheets may preferably be made using slurry in which a mixed powder of, for example, alumina and glass, is mixed with an organic binder, a solvent, and other suitable ingredients. The plurality of ceramic green sheets are stacked, pressure bonded, and then fired at a low temperature of about 1000° C. (low-temperature firing), for example.

It should be noted that the substrate 10 may preferably be, for example, a resin substrate of glass epoxy resin, liquid crystal polymer, or other suitable resin, a glass substrate, or other suitable substrate.

Furthermore, various wiring patterns 10a are provided on the ceramic green sheets by printing with a conductive paste. Moreover, via-holes are provided at predetermined positions of the ceramic green sheets by, for example, laser processing. In the via-holes, via-conductors (not shown) connecting layers are formed by filling the via-holes with a conductive paste including, for example, Ag, Cu, or other suitable material.

In addition, mounting electrodes 11a to mount electronic components and chip components are disposed on the wiring 10a. The wiring 10a and the mounting electrodes 11a are preferably made of, for example, a conductive material, such as Ag, Cu, or Au.

The IC chip 11, the coupler 12, and the duplexers 13, which are disposed on the one surface of the substrate 10, are each an electronic component and each structured into a chip.

The IC chip 11 is, for example, a system IC including, on a surface facing the one surface of the substrate 10, electrical circuits (not shown) to process RF signals and baseband signals. The IC chip 11 may have, for example, a structure of a bare chip that is cut out from a wafer of a semiconductor, such as Si, for example, or a structure of wafer level chip size package (WL-CSP). The IC chip 11 is mounted to face the one surface of the substrate 10. At that time, the IC chip 11 is joined to the wiring 10a by the mounting electrodes 11a.

The coupler 12 detects, in a sub line, electric power passing through a main line.

The duplexer 13 electrically isolates a transmit path from a receive path. In the duplexer 13, one antenna port (a common terminal) is shared by two filters of different frequency bands.

The chip component 14 is preferably, for example, an inductor, a capacitor, or a resistor, which is structured into a chip. Electrodes (not shown) are provided by using conductive members at both ends of the chip component 14 in a longitudinal direction.

Furthermore, the chip components 16, 17, and 18, which are disposed on the other surface of the substrate 10, are preferably, for example, an inductor, a capacitor, or a resistor. Electrodes 16a are defined by conductive members at both ends of the chip component 16 in a longitudinal direction. Electrodes 17a are defined by conductive members at both ends of the chip component 17 in a longitudinal direction. Similarly, electrodes (not shown) are defined by conductive members at both ends of the chip component 18 in a longitudinal direction.

The connection terminal 20 is preferably, for example, a metal post having a pillar shape with a diameter of about 0.2 mm and a length of about 0.4 mm in a longitudinal direction. It should be noted that the connection terminal 20 may have a cylindrical shape or a rectangular column shape. A plurality of standing connection terminals 20 are provided at regular intervals at positions that are a predetermined distance apart from the periphery of the substrate 10. For example, the plurality of standing multiple connection terminals 20 are disposed at about 0.2 mm intervals at positions about 1.0 mm spaced apart from the periphery of the substrate 10.

The connection terminal 20 is preferably made of, for example, copper. One end of the connection terminal 20 in a longitudinal direction is coupled to, for example, the wiring 10a, an electronic component, or a chip component, which are provided on the other surface of the substrate 10. The connection terminal 20 is provided perpendicular or substantially perpendicular to the substrate 10. Here, perpendicular or substantially perpendicular denotes that the axis connecting the centers of both ends of the connection terminal 20 in a longitudinal direction is perpendicular or substantially perpendicular to the substrate 10.

Furthermore, as described above, the connection terminal 20 is structured such that the side that is not coupled to the substrate 10, that is, the other end of the connection terminal 20 in a longitudinal direction is flush with a surface of a sealing resin 30b. With this configuration, the connection terminal 20 is coupled to an electronic component or other element that is disposed outside the circuit module 1.

The terminal-use circuit component 21 defines and functions as both a metal post defining an external connection terminal and an inductor. The terminal-use circuit component 21 preferably has, for example, a pillar shape of about 0.2 mm×about 0.2 mm×about 0.4 mm. It should be noted that the terminal-use circuit component 21 may have a cylindrical shape or a rectangular column shape. Electrodes 21a are provided by using conductive members at both ends of the terminal-use circuit component 21 in a longitudinal direction (two end surfaces of the terminal-use circuit component 21). In addition, an inductor (a coil) 21b is provided inside the terminal-use circuit component 21.

The electrode 21a provided at one end of the terminal-use circuit component 21 in a longitudinal direction is coupled to the wiring 10a with an electrode 41 that is provided on the other surface of the substrate 10. At that time, the terminal-use circuit component 21 is provided, on the substrate 10, to be perpendicular or substantially perpendicular to the substrate 10. Here, perpendicular or substantially perpendicular denotes that the axis connecting the centers of the electrodes 21a disposed at the both ends of the terminal-use circuit component 21 is perpendicular or substantially perpendicular to the substrate 10. The terminal-use circuit component 21 is disposed, instead of a connection terminal 20, at the position to dispose the connection terminal 20.

Furthermore, as described above, the terminal-use circuit component 21 is structured such that the electrode 21a provided at the side that is not coupled to the substrate 10, that is, the other end of the terminal-use circuit component 21 in a longitudinal direction is flush with the surface of the sealing resin 30b. With this configuration, the terminal-use circuit component 21 is coupled to an electronic component or other element that is disposed outside the circuit module 1.

By providing the terminal-use circuit components 21, it is unnecessary to provide inductors in positions of spaces 15 provided for inductors (chip components) that each define and function as an inductor and do not define and function as a metal post as an external connection terminal, and thus, the spaces 15 remain unused.

A configuration of the terminal-use circuit component 21 will be described in detail later.

Moreover, as illustrated in FIG. 3, the one surface of the substrate 10 is sealed by a sealing resin 30a to cover the IC chip 11, the coupler 12, and the duplexers 13. The sealing resins 30a and 30b are preferably made of, for example, epoxy resin. Similarly, the other surface of the substrate 10 is sealed by the sealing resin 30b to cover the chip components 16 and 17, side surfaces of the connection terminals 20, and side surfaces of the terminal-use circuit components 21. At that time, the other ends of the connection terminals 20 and the terminal-use circuit components 21 in a longitudinal direction, that is, the other ends that are disposed opposite to the substrate 10, are disposed such that the connection terminals 20 and the electrodes 21a are flush with the surface of the sealing resin 30b. It should be noted that, in FIGS. 1 and 2, illustrations of the sealing resins 30a and 30b are omitted.

Figure 4A:
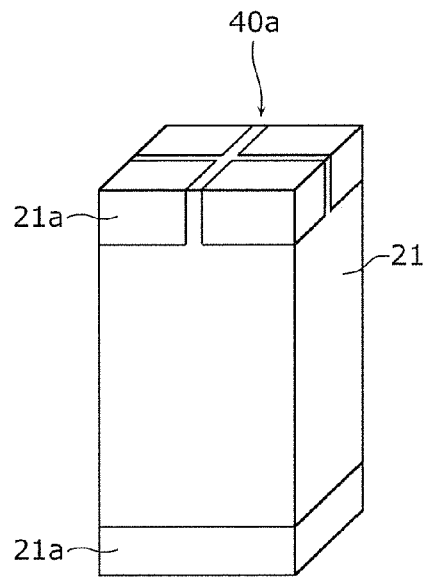
FIG. 4A is a schematic diagram illustrating a configuration of a terminal-use circuit component of the circuit module according to the Preferred Embodiment 1 of the present invention.
Figure 4B:
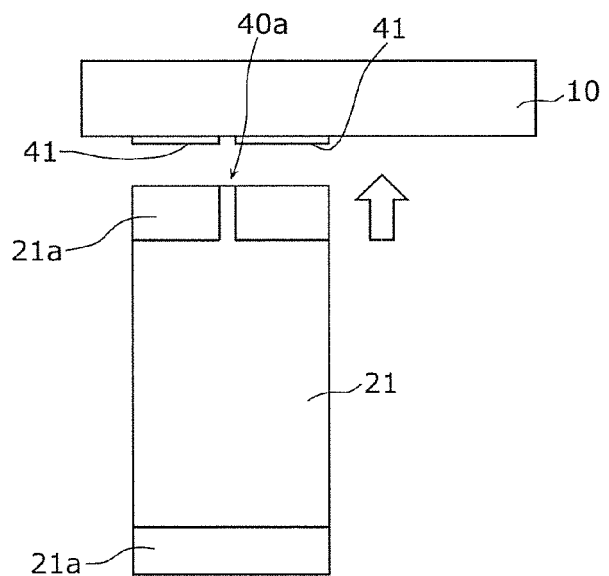
FIG. 4B is a schematic diagram illustrating a configuration of a joining portion between the terminal-use circuit component and a substrate of the circuit module according to the Preferred Embodiment 1 of the present invention.

Next, a configuration of the terminal-use circuit component 21 is described. FIG. 4A is a schematic diagram illustrating a configuration of the terminal-use circuit component of the circuit module 1 according to the present preferred embodiment. FIG. 4B is a schematic diagram illustrating a configuration of a joining portion between the terminal-use circuit component 21 and the substrate 10 of the circuit module 1 according to the present preferred embodiment.

As described above, the terminal-use circuit component 21 includes the electrodes 21a at its both ends. In addition, the inductor (the coil) 21b is provided inside the terminal-use circuit component 21. Furthermore, the electrode 21a on the side to be coupled to the wiring 10a of the substrate 10 with the electrode interposed therebetween is divided into four portions by a groove 40a that passes through the rotation axis passing through the center of the inductor 21b in a longitudinal direction. The groove 40a is an intersecting cross defining a void at which a conductive joining member described below is not disposed. In other words, the four divided portions of the electrode 21a are disposed around the groove 40a as an intersecting cross.

Moreover, on the four divided portions of the electrode 21a on the side to be coupled to the wiring 10a with the electrode 41 of the substrate 10 interposed therebetween, conductive joining members (not shown) are disposed. The conductive joining members are preferably, for example, solder. The conductive joining members are disposed at the center portions on the four respective divided portions of the electrode 21a as illustrated in FIG. 4A when the substrate 10 and the terminal-use circuit component 21 are coupled to each other.

Further, as illustrated in FIG. 4B, on the surface of the substrate 10 facing the electrode 21a of the terminal-use circuit component 21, four divided portions of the electrode 41 are disposed at positions corresponding to the four respective divided portions of the electrode 21a provided on the terminal-use circuit component 21. The electrode 41 is preferably made of, for example, a metal such as Ag, Cu, or Au. The four divided portions of the electrode 21a and the four divided portions of the electrode 41 are respectively joined by the conductive joining members that are disposed between the electrode 21a and the electrode 41 and that are melted by heat to join them to each other.

Here, at the time of coupling the substrate 10 and the terminal-use circuit component 21, since the conductive joining members are disposed at the center portions of the four respective divided portions of the electrode 21a, when melted by heat, the conductive joining members spread uniformly on the electrode 21a such that the distance between the electrode 21a and the electrode 41 is consistent or substantially consistent. Furthermore, the groove 40a is provided between the four divided portions of the electrode 21a and the groove 40a is a void at which a conductive joining member is not disposed. As a result, the terminal-use circuit component 21 does not tilt in any particular direction. As a result, the terminal-use circuit component 21 is able to be joined perpendicularly or substantially perpendicularly to the substrate 10.

With this configuration, as illustrated in FIG. 3, the terminal-use circuit component 21 is able to be stably disposed perpendicularly or substantially perpendicularly to the substrate 10. As a result, the electrode 21a of the terminal-use circuit component 21 on the side not coupled to the substrate 10 is able to be used as an external connection terminal. In this case, because the terminal-use circuit component 21 is stably disposed perpendicularly or substantially perpendicularly to the substrate 10, the electrode 21a on the side not coupled to the substrate 10 is able to be stably coupled to a component that is disposed outside. As a result, the operation of the circuit module 1 is stable.

It should be noted that the conductive joining member may also be disposed on the electrode 41. In this case, the conductive joining member may be coupled to the wiring 10a with the electrode 41 that is interposed therebetween and that is provided on the substrate 10. Furthermore, the conductive joining member is not limited to being made of solder and may be another conductive member. Moreover, in the above-described configuration, the electrode 21a and the electrode 41 are each divided into four portions, but the electrode 21a and the electrode 41 are not limited to have four divided portions and may be divided into three portions or any number of portions.

In the above-described circuit module 1 according to the present preferred embodiment, the electrode 21a is divided into four portions by the groove 40a and the conductive joining members are disposed at the center portions of the four portions of the electrode 21a at the time of coupling the substrate 10 and the terminal-use circuit component 21, and therefore, a conductive joining member is not disposed in the groove 40a between the four portions of the electrode 21a of the terminal-use circuit component 21. Accordingly, when the four portions of the electrode 21a and the four portions of the electrode 41 are joined respectively to each other, the conductive joining members spread uniformly between the four portions of the electrode 21a and the four portions of the electrode 41. As a result, it is possible to reduce the tilt of the terminal-use circuit component 21 disposed with respect to the substrate 10. Thus, the terminal-use circuit component 21 are able to be disposed perpendicularly or substantially perpendicularly to the substrate 10.

Furthermore, since the terminal-use circuit component 21 defines and functions as both an external connection terminal and an inductor, it is unnecessary to provide spaces 15 for additional inductors. Therefore, the size of the circuit module 1 is able to be reduced.

Moreover, because the terminal-use circuit component 21 is stably disposed perpendicularly or substantially perpendicularly to the substrate 10, the electrode 21a on the side not coupled to the substrate 10 is able to be stably coupled to a component that is disposed outside.

Consequently, with the circuit module 1, it is possible to reduce the size and improve the performance thereof.

Next, a Modification 1 of the present preferred embodiment is described. The terminal-use circuit component 21 of the present modification differs from the terminal-use circuit component 21 described in the Preferred Embodiment 1 in the configuration of the electrode 21a.

Figure 5A:
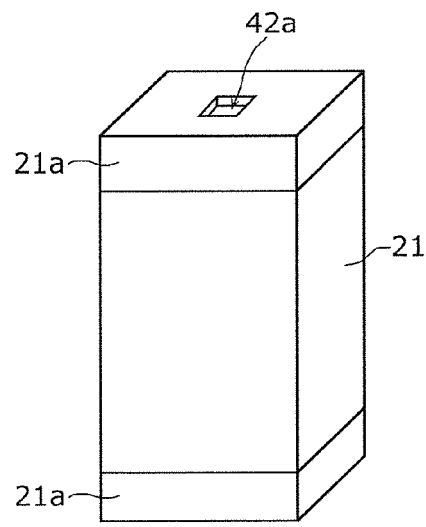
FIG. 5A is a schematic diagram illustrating a configuration of the terminal-use circuit component of the circuit module according to a Modification 1 of the Preferred Embodiment 1 of the present invention.
Figure 5B:
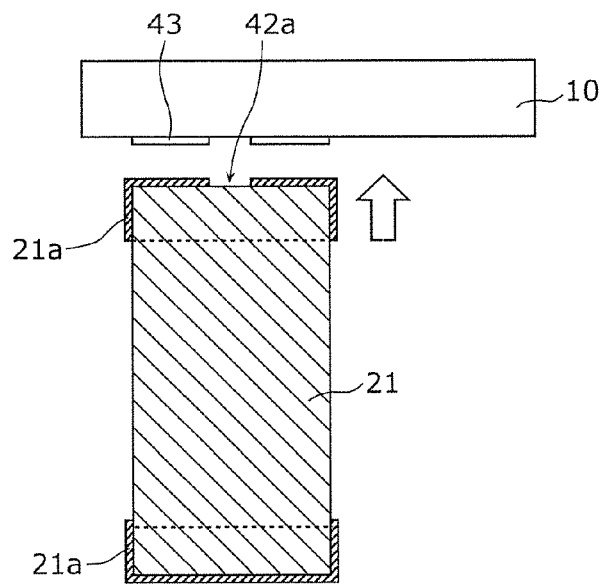
FIG. 5B is a schematic sectional view illustrating a configuration of the joining portion between the terminal-use circuit component and the substrate of the circuit module according to the Modification 1 of the Preferred Embodiment 1 of the present invention.

FIG. 5A is a schematic diagram illustrating a configuration of the terminal-use circuit component 21 of the circuit module 1 according to the present modification. FIG. 5B illustrates a schematic sectional view of a configuration of the joining portion between the terminal-use circuit component 21 and the substrate 10 of the circuit module 1 according to the present modification. In FIG. 5B, for ease of explanation of the configuration of the terminal-use circuit component 21, the terminal-use circuit component 21 is illustrated in a sectional view obtained by cutting the terminal-use circuit component 21 along a plane passing through the axis connecting the centers of the electrodes 21a, which are disposed at the both ends of the terminal-use circuit component 21, to each other.

In the terminal-use circuit component 21 of the present modification, the electrode 21a that is coupled to the substrate 10 includes a void 42a in a center portion. A conductive joining member (not shown) is, similarly to the conductive joining member (not shown) described in Preferred Embodiment 1, preferably, for example, solder. The conductive joining member is disposed over the entire or substantially the entire surface of the electrode 21a excluding the center portion of the electrode 21a. The conductive joining member is not disposed in the void 42a in the center portion of the electrodes 21a.

In addition, as illustrated in FIG. 5B, on the surface of the substrate 10 facing the electrode 21a of the terminal-use circuit component 21, an electrode 43 is disposed at a position corresponding to the electrode 21a. The electrode 43 is preferably made of, for example, a metal such as Ag, Cu, or Au. The electrode 21a and the electrode 43 are joined by the conductive joining member that is disposed between the electrode 21a and the electrode 43 and that is melted by heat to join them to each other.

Here, when melted by heat, the conductive joining member spreads uniformly on the electrode 21a such that the distance between the electrode 21a and the electrode 43 is consistent or substantially consistent. In addition, the void 42a is a portion in which the conductive joining member is not disposed. Thus, the terminal-use circuit component 21 does not tilt in any particular direction. As a result, it is possible to join the terminal-use circuit component 21 perpendicularly or substantially perpendicularly to the substrate 10.

With this configuration, also in the present modification, the terminal-use circuit component 21 is able to be stably disposed perpendicularly or substantially perpendicularly to the substrate 10. Furthermore, since the terminal-use circuit component 21 defines and functions as both an external connection terminal and an inductor, it is unnecessary to provide spaces for additional inductors. Consequently, with the circuit module 1, it is possible to reduce the size and improve the performance thereof.

Next, a Modification 2 of the present preferred embodiment is described. The terminal-use circuit component 21 of the present modification differs from the terminal-use circuit component 21 described in the Preferred Embodiment 1 in that the terminal-use circuit component 21 of the present modification includes a hollow portion 44 extending from one electrode 21a side of the electrodes 21a provided on the both sides of the terminal-use circuit component 21 in a longitudinal direction through the electrode 21a to a portion of the terminal-use circuit component 21. In addition, the substrate 10 of the present modification differs from the substrate 10 described in Preferred Embodiment 1 in that the substrate 10 of the present modification includes a protruding portion 45 at a position of the substrate 10 facing the hollow portion 44.

Figure 6A:
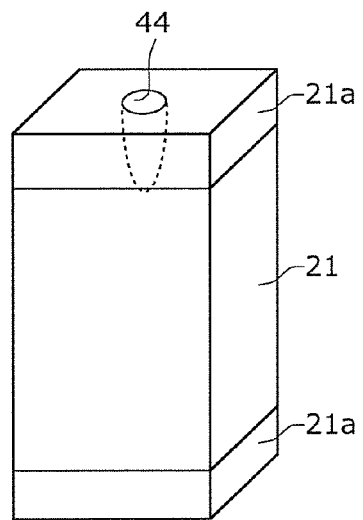
FIG. 6A is a schematic diagram illustrating a configuration of the terminal-use circuit component of the circuit module according to a Modification 2 of the Preferred Embodiment 1 of the present invention.
Figure 6B:
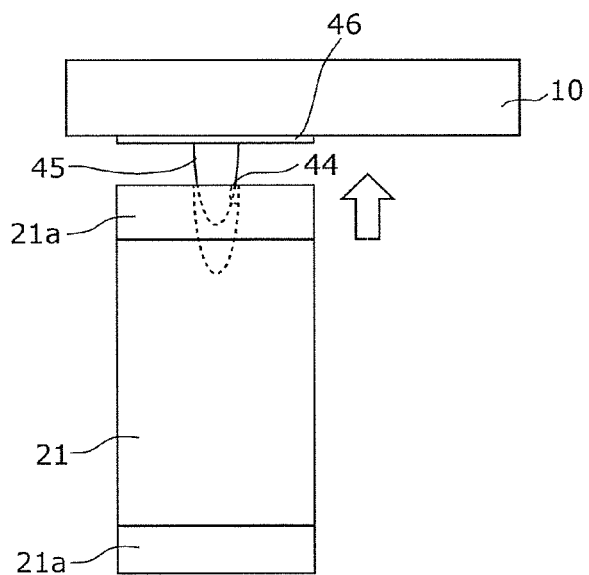
FIG. 6B is a schematic diagram illustrating a configuration of the joining portion between the terminal-use circuit component and the substrate of the circuit module according to the Modification 2 of the Preferred Embodiment 1 of the present invention.

FIG. 6A is a schematic diagram illustrating a configuration of the terminal-use circuit component 21 of the circuit module 1 according to the present modification. FIG. 6B is a schematic diagram illustrating a configuration of the joining portion between the terminal-use circuit components 21 and the substrate 10 of the circuit module 1 according to the present modification.

As illustrated in FIG. 6A, the terminal-use circuit component 21 of the present modification includes the hollow portion 44 in the center portion of the electrode 21a that is coupled to the substrate 10. The hollow portion 44 corresponds to the void described in the Preferred Embodiment 1. Regarding the hollow portion 44, is preferably, for example, an opening in the surface of the electrode 21a has a circular or substantially circular shape and the hollow portion 44 has a concave shape in a depth direction and includes a curved surface. The hollow portion 44 has a depth extending to the terminal-use circuit component 21 through the electrode 21a.

In addition, as illustrated in FIG. 6B, on the surface of the substrate 10 facing the hollow portion 44 of the terminal-use circuit component 21, the protruding portion 45 is disposed at a position corresponding to the hollow portion 44. In the protruding portion 45, the portion in contact with the substrate preferably has a circular or substantially circular shape identical or substantially identical to the shape of the opening of the hollow portion 44 in the electrode 21a. Furthermore, the protruding portion 45 is sized to enable the protruding portion 45 to be inserted into the hollow portion 44. For example, the protruding portion 45 is structured such that the protruding portion 45 protrudes from the substrate 10 in a convex shape and includes a curved surface in a shape identical or substantially identical to that of the concave curved surface of the hollow portion 44. The protruding portion 45 has a height to extend to the bottom of the hollow portion 44 through the electrode 21a when the protruding portion 45 is inserted into the hollow portion 44. The protruding portion 45 is preferably made of a material that does not have conductivity, for example, a resin.

In addition, as illustrated in FIG. 6B, the protruding portion 45 of the substrate 10 is coupled to the wiring 10a with the electrode 46 interposed therebetween. On the electrode 46, a conductive joining member (not shown) is provided. The conductive joining member is preferably, for example, solder. The electrode 21a and the electrode 46 are joined by the conductive joining member that is disposed between the electrode 21a and the electrode 46 and that is melted by heat to join them to each other.

The conductive joining member may be disposed on the electrode 21a side of the terminal-use circuit component 21, instead of the electrode 46 side of the substrate 10. Moreover, the shape of the opening of the hollow portion 44 in the electrode 21a is not limited to a circular or substantially circular shape but may be a rectangular or substantially rectangular shape or another shape. Further, the shape of the hollow portion 44 in the depth direction is not necessarily a shape including the above-described curved surface but may be a shape including a corner. Furthermore, the shape of the protruding portion 45 in the substrate 10 may be modified depending on the shape of the hollow portion 44.

With this configuration, the protruding portion 45 is inserted into the hollow portion 44 at a fixed angle. For example, when the protruding portion 45 and the hollow portion 44 are respectively provided perpendicularly or substantially perpendicularly to the substrate 10 and the terminal-use circuit component 21, the protruding portion 45 is inserted perpendicularly or substantially perpendicularly into the hollow portion 44. As a result, the terminal-use circuit component 21 is able to be stably disposed perpendicularly or substantially perpendicularly to the substrate 10.

Next, a Modification 3 of the present preferred embodiment is described. The terminal-use circuit component 21 of the present modification differs from the terminal-use circuit component 21 described in the Modification 2 of Preferred Embodiment 1 in that the terminal-use circuit component 21 of the present modification includes, as the hollow portion 44, a through-hole 47 that is disposed in the center portion of the electrode 21a and that passes through the chip. In addition, the substrate 10 differs from the substrate 10 described in the Modification 2 of Preferred Embodiment 1 in that the substrate 10 includes a support rod 48 as the protruding portion 45.

Figure 7A:
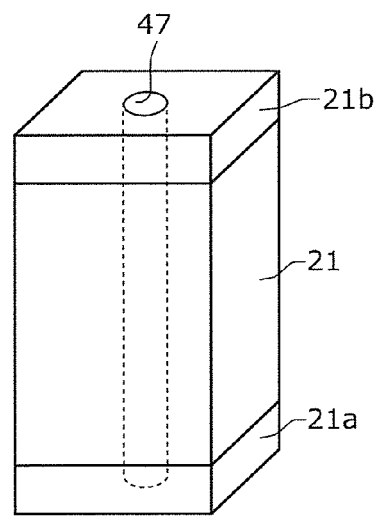
FIG. 7A is a schematic diagram illustrating a configuration of the terminal-use circuit component of the circuit module according to a Modification 3 of the Preferred Embodiment 1 of the present invention.
Figure 7B:
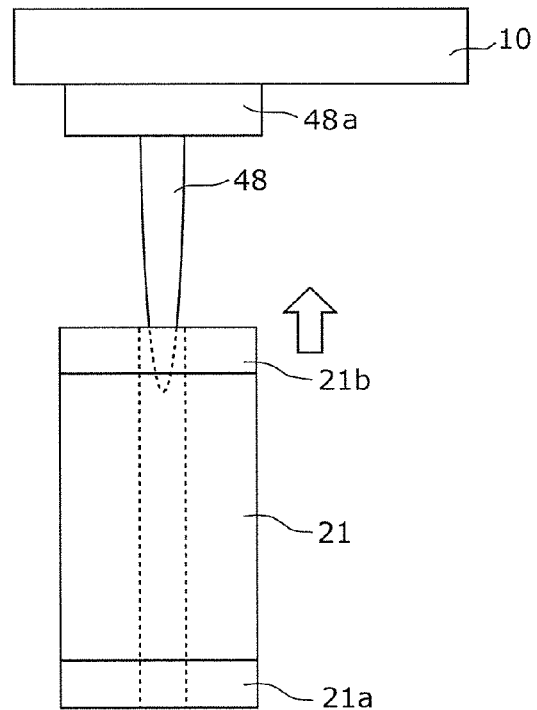
FIG. 7B is a schematic diagram illustrating a configuration of the joining portion between the terminal-use circuit component and the substrate of the circuit module according to a Modification 3 of the Preferred Embodiment 1 of the present invention.

FIG. 7A is a schematic diagram illustrating a configuration of the terminal-use circuit component 21 of the circuit module 1 according to the present modification. FIG. 7B is a schematic diagram illustrating a configuration of the joining portion between the terminal-use circuit component 21 and the substrate 10 of the circuit module 1 according to the present modification.

As illustrated in FIG. 7A, the terminal-use circuit component 21 of the present modification includes the through-hole 47 passing through from the center portion of the electrode 21a that is coupled to the substrate 10 to the electrode 21a on the opposite side. The through-hole 47 corresponds to the void described in the Preferred Embodiment 1, or the hollow portion described in the Modification 2. In the through-hole 47, for example, an opening in the surface of the electrode 21a preferably has a circular or substantially circular shape.

In addition, as illustrated in FIG. 7B, on the substrate 10, the support rod 48 is disposed at a position facing the through-hole 47 of the terminal-use circuit component 21. The support rod 48 corresponds to the protruding portion described in the Modification 2. The support rod 48 is integrally provided with an electrode 48a. The electrode 48a is disposed on the substrate 10 side. In the support rod 48, the portion in contact with the substrate 10 preferably has, for example, a circular or substantially circular shape identical or substantially identical to the shape of the opening of the through-hole 47 in the electrode 21a. Furthermore, the support rod 48 is sized to enable the support rod 48 to be inserted into the through-hole 47. For example, the support rod 48 having a cylindrical or substantially cylindrical shape with the same or substantially the same diameter as that of the through-hole 47 is structured to protrude in a projecting shape from the substrate 10. The support rod 48 is preferably made of, for example, a conductive material. such as copper or aluminum.

It should be noted that, similarly to the Modification 2, an electrode 21b made of, for example, a metal is disposed around the support rod 48 of the substrate 10 or the through-hole 47 of the terminal-use circuit component 21. A conductive joining member (not shown) is disposed between the electrode 21b of the terminal-use circuit component 21 and the electrode 48a. When melted by heat, the conductive joining member spreads uniformly between the electrode 48a and the electrode 21b of the terminal-use circuit component 21. Since the support rod 48 is inserted into the through-hole 47, the terminal-use circuit component 21 does not tilt in any particular direction. As a result, the terminal-use circuit component 21 is able to be joined perpendicularly or substantially perpendicularly to the substrate 10.

It should be noted that the shape of the opening of the through-hole 47 in the electrode 21b is not limited to a circular or substantially circular shape but may be a rectangular or substantially rectangular shape or another shape. Furthermore, the shape of the protruding portion 45 in the substrate 10 may be modified depending on the shape of the through-hole 47.

With this configuration, the support rod 48 is inserted into the through-hole 47 at a fixed angle and the length of the support rod 48 and the length of the through-hole 47 are both longer than those of the Modification 2, and as a result, the terminal-use circuit component 21 is able to be stably disposed perpendicularly or substantially perpendicularly to the substrate 10.

Preferred Embodiment 2

Figure 8:
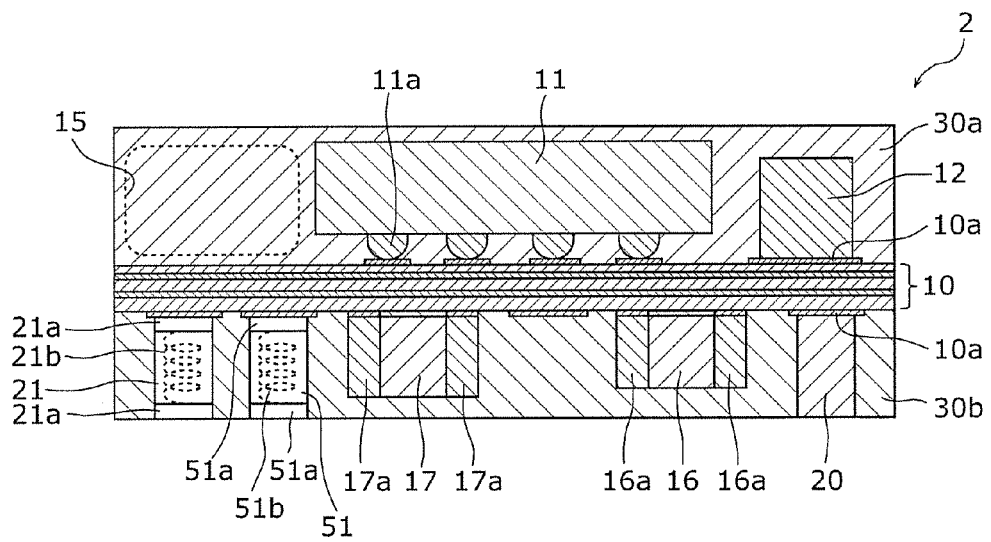
FIG. 8 illustrates a sectional view of a configuration of a portion of a circuit module according to a Preferred Embodiment 2 of the present invention.

Next, a Preferred Embodiment 2 of the present invention is described with reference to FIGS. 8 and 9. FIG. 8 illustrates a sectional view of a configuration of a portion of a circuit module 2 according to the present preferred embodiment.

The circuit module 2 according to the present preferred embodiment differs from the circuit module 1 according to the Preferred Embodiment 1 in that the circuit module 2 according to the present preferred embodiment includes a terminal-use circuit component 51 disposed close to the terminal-use circuit component 21. It should be noted that, regarding the same or substantially the same configuration as that of the circuit module 1 described in Preferred Embodiment 1, the details are omitted in the following description. Here, the terminal-use circuit component 51 disposed "close" to the terminal-use circuit component 21 denotes that, for example, when the terminal-use circuit component 21 and the terminal-use circuit component 51 are both inductors, the two inductors are magnetically coupled to each other. For example, any ground or any via that may reduce or prevent the magnetically coupling between two inductors is not disposed between the two inductors. In the present preferred embodiment, between the terminal-use circuit component 21 and the terminal-use circuit component 51, a ground or via is not provided.

As illustrated in FIG. 8, similarly to the circuit module described in Preferred Embodiment 1, the circuit module 2 includes electronic components and other elements that are disposed on both surfaces of the substrate 10 and the both surfaces are sealed with a sealing resin. The circuit module 2 is preferably, for example, a high-frequency circuit module. The IC chip 11, the coupler 12, and other components are disposed on one surface of the circuit module 2. In addition, the chip components 16 and 17, the connection terminal 20, and the terminal-use circuit components 21 and 51 are disposed on the other surface of the circuit module 2. The terminal-use circuit components 21 and 51 are disposed close to each other. The configuration of the terminal-use circuit component 21 is the same or substantially the same as that of the terminal-use circuit component 21 described in Preferred Embodiment 1.

The terminal-use circuit component 51, similarly to the terminal-use circuit component 21, defines and functions as both a metal post defining an external connection terminal and an inductor. The terminal-use circuit component 51 preferably has, for example, a pillar shape. Electrodes 51a are provided by using conductive members at both ends of the terminal-use circuit component 51 in a longitudinal direction. In addition, a coil 51b is provided inside the terminal-use circuit component 51.

The electrode 51a provided at one end of the terminal-use circuit component 51 in a longitudinal direction are coupled to the wiring 10a provided on the other surface of the substrate 10. At that time, the terminal-use circuit component 51 is provided on the substrate 10 to be perpendicular or substantially perpendicular to the substrate 10. The terminal-use circuit component 51 is provided instead of a connection terminal 20 at the position at which the connection terminal 20 is disposed.

Furthermore, the electrode 51a on the side of the terminal-use circuit component 51 not coupled to the substrate 10 is flush or substantially flush with the surface of the sealing resin 30b. With this configuration, the terminal-use circuit component 51 is coupled to an electronic component that is disposed outside the circuit module 2.

Figure 9:
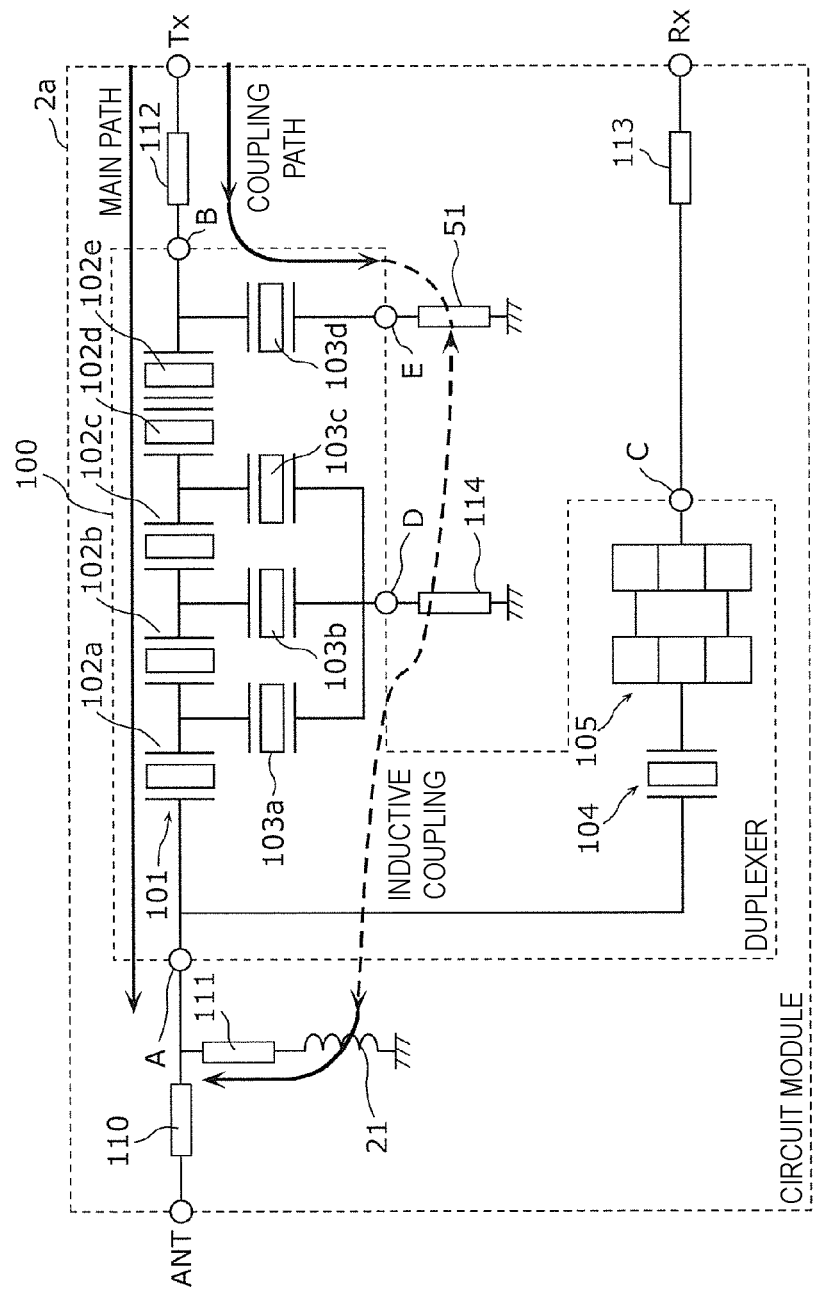
FIG. 9 is a circuit configuration diagram of the circuit module according to the Preferred Embodiment 2 of the present invention.

FIG. 9 is a circuit configuration diagram of the circuit module 2 according to the present preferred embodiment. As illustrated in FIG. 9, the circuit module 2a includes a duplexer 100, chip components 110, 111, 112, 113, and 114, and the terminal-use circuit components 21 and 51. Here, the chip components 110, 111, 112, 113, and 114, and the terminal-use circuit components 21 and 51 are preferably inductors, for example.

The duplexer 100 includes a ladder filter unit 101 and a longitudinally-coupled filter unit 105 defined by surface acoustic wave filters. The ladder filter unit 101 is disposed between a port (an antenna port) ANT that is coupled to an antenna and a port Tx as a transmit-side port. The longitudinally-coupled filter unit 105 is a receive filter and disposed between the port ANT and a port Rx as a receive-side port.

The ladder filter unit 101 includes series arm resonators 102a, 102b, 102c, 102d, and 102e, which are connected in series between a port A and a port B, parallel arm resonators 103a, 103b, and 103c, which are each connected between ground and a respective path between the series arm resonators 102a, 102b, 102c, and 102d, and a parallel arm resonator 103d, which is connected between ground and a point between the series arm resonator 102e and the port B. The longitudinally-coupled filter unit 105 includes a plurality of resonators that are disposed in a propagation direction of surface acoustic waves and reflectors (not shown) that are disposed on both sides of the resonators. In addition, between the port A and the longitudinally-coupled filter unit 105, a resonator 104 is connected in series with the longitudinally-coupled filter unit 105.

Furthermore, between the port ANT and the port A, the chip component 110, which is connected in series, and the chip component 111, which is connected between ground and a path between the chip component 110 and the port A, are disposed. Between the chip component 111 and ground, the terminal-use circuit component 21 is disposed. In other words, the terminal-use circuit component 21 is connected between ground and a point between the port ANT and the port A. The terminal-use circuit component 21 is an inductor and corresponds to a first inductor of the present preferred embodiment.

Between the port B and the port Tx, the chip component 112 is disposed.

Between ground and a port D to which the parallel arm resonators 103a, 103b, and 103c are connected, the chip component 114 is connected.

Further, in the ladder filter unit 101, between ground and a port E to which the parallel arm resonator 103d disposed closest to the port Tx side is connected, the terminal-use circuit component 51 is connected. In other words, the terminal-use circuit component 51 is connected between ground and the parallel arm resonator 103d that is connected to a path from the port Tx as an input port through the port B to the ladder filter unit 101. The terminal-use circuit component 51 is an inductor and corresponds to a second inductor of the present preferred embodiment.

Further, between the port C connected to the longitudinally-coupled filter unit 105 and the port Rx, the chip component 113 is disposed.

In this circuit, in addition to high frequency transmission signals that are input from the port Tx, spurious waves, such as harmonics, of transmission high frequency signals are also output to the port ANT via the port B and the port A (the main path). On the other hand, in the ladder filter unit 101, the terminal-use circuit component 51, the chip component 114, and the terminal-use circuit component 21 are disposed. Since the terminal-use circuit component 51 and the terminal-use circuit component 21 are disposed close to each other, by causing a current to flow in the terminal-use circuit component 51 and the terminal-use circuit component 21, inductive coupling occurs between these chip components. The spurious waves, such as harmonics, of high frequency transmission signals that are input from the port Tx pass through from the port Tx via the chip component 112 and the parallel arm resonator 103d, further through the chip components 111 and 110 via the terminal-use circuit component 51, the chip component 114, and the terminal-use circuit component 21, which are inductively coupled, and ultimately, the spurious waves are output to the port ANT (the coupling path).

Here, the spurious waves that are outside the pass band and that flow in the main path are also routed into the coupling path and transformed to signals having a phase opposite to that of the spurious waves that are outside the pass band and that flow in the main path, so that the spurious waves that are outside the pass band and that flow in the main path and the spurious waves that are outside the pass band and that flow in the coupling path cancel each other out in the circuit module 2a. Thus, the isolation characteristics are able to be improved in the circuit module 2a.

Preferred Embodiment 3

Figure 10A:
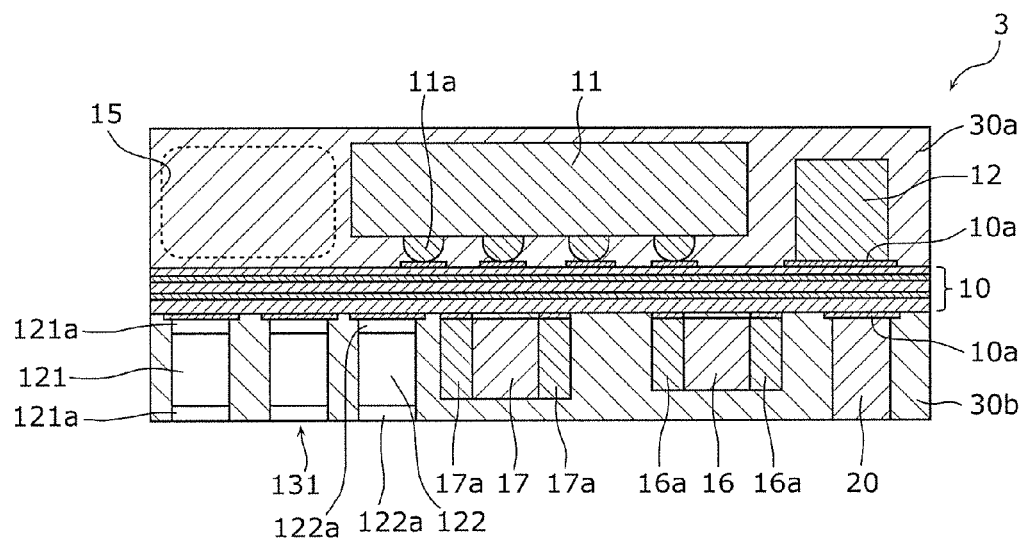
FIG. 10A illustrates a sectional view of a configuration of a circuit module according to a Preferred Embodiment 3 of the present invention.
Figure 10B:
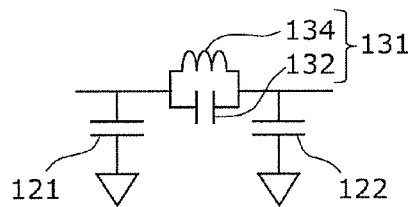
FIG. 10B is a circuit configuration diagram of a portion of the circuit module according to the Preferred Embodiment 3 of the present invention.
Figure 11A:
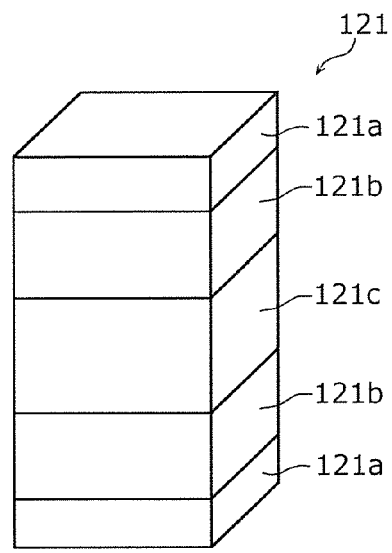
FIG. 11A is a conceptual diagram illustrating a configuration of the terminal-use circuit component of the circuit module according to the Preferred Embodiment 3 of the present invention.
Figure 11B:
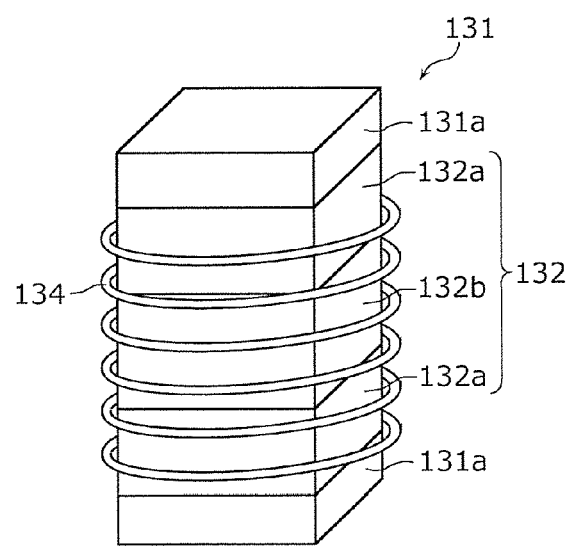
FIG. 11B is a conceptual diagram illustrating a configuration of the terminal-use circuit component of the circuit module according to the Preferred Embodiment 3 of the present invention.

Next, a Preferred Embodiment 3 of the present invention is described with reference to FIGS. 10A to 11B. FIG. 10A illustrates a sectional view of a configuration of a circuit module 3 according to the present preferred embodiment. FIG. 10B is a circuit configuration diagram of a portion of the circuit module 3 according to the present preferred embodiment. FIG. 11A is a conceptual diagram illustrating a configuration of a terminal-use circuit component 121 of the circuit module 3 according to the present preferred embodiment. FIG. 11B is a conceptual diagram illustrating a configuration of a terminal-use circuit component 131 of the circuit module 3 according to the present preferred embodiment.

The circuit module 3 according to the present preferred embodiment 1 differs from the circuit module 1 according to the Preferred Embodiment 1 in that the circuit module 3 according to the present preferred embodiment includes three terminal-use circuit components that are disposed close to one another and that define a low pass filter. It should be noted that, concerning the same or substantially the same configuration as that of the circuit module 1 described in the Preferred Embodiment 1, details are omitted in the following description.

As illustrated in FIG. 10A, similarly to the circuit module 1 described in Preferred Embodiment 1, the circuit module 3 has a configuration in which electronic components and other elements are disposed on both surfaces of the substrate 10 and the both surfaces are sealed with a sealing resin. The circuit module is preferably, for example, a high-frequency circuit module. The IC chip 11, the coupler 12, and other components are disposed on one surface of the circuit module 3. In addition, the chip components 16 and 17, the connection terminal 20, and the terminal-use circuit components 121, 122, and 131 are disposed on the other surface of the circuit module 3. The terminal-use circuit components 121, 122, and 131 are disposed close to one another.

Further, the terminal-use circuit components 121 and 122 are preferably both capacitors, for example. The terminal-use circuit component 131 is preferably defined by, for example, a capacitor 132 and an inductor 134 that are connected in parallel. The terminal-use circuit component 131 is, as illustrated in FIG. 10A, disposed between the terminal-use circuit components 121 and 122. As illustrated in FIG. 10B, the terminal-use circuit components 121 and 122 are connected between the wiring on respective sides of the terminal-use circuit component 131 and respective ground terminals. Thus, the terminal-use circuit components 121, 122, and 131 define and function as a low pass filter.

It should be noted that the terminal-use circuit components 121 and 122 correspond respectively to a second capacitor and a third capacitor of the present preferred embodiment. Furthermore, the inductor 134 and the capacitor 132 of the terminal-use circuit component 131 correspond respectively to a third inductor and a first capacitor of the present preferred embodiment.

In the terminal-use circuit component 121, as illustrated in FIG. 11A, electrodes 121a are disposed on both sides of the terminal-use circuit component 121 in a longitudinal direction, and metal posts 121b that electrically conduct with the respective electrodes 121a are provided so that the longitudinal direction of the terminal-use circuit component 121 is perpendicular or substantially perpendicular to the substrate 10. The metal posts 121b are preferably made of, for example, copper. In addition, between the metal posts 121b, a dielectric 121c is disposed. Thus, the terminal-use circuit component 121 defines and functions as a capacitor. It should be noted that the terminal-use circuit component 122 has the same or substantially the same structure as that of the terminal-use circuit component 121.

In the terminal-use circuit component 131, similarly to the terminal-use circuit component 121, as illustrated in FIG. 11B, electrodes 131a are disposed on both sides of the terminal-use circuit component 131 in a longitudinal direction, and metal posts 132a that electrically conduct with the respective electrodes 131a are provided so that the longitudinal direction of the terminal-use circuit component 131 is perpendicular or substantially perpendicular to the substrate 10. The metal posts 132a are composed of, for example, copper. In addition, between the metal posts 132a, a dielectric 132b is disposed. Moreover, as illustrated in FIG. 11B, between one of the electrodes 131a and the other of the electrodes 131a of the terminal-use circuit component 131, a coil defining the inductor 134 is provided to be wound around the metal posts 132a and the dielectric 132b. Thus, in the terminal-use circuit component 131, the capacitor 132 and the inductor 134 are connected in parallel.

The electrodes 121a and 122a disposed respectively at one end of the terminal-use circuit component 121 and one end of the terminal-use circuit component 122 in a longitudinal direction are each coupled to the wiring 10a provided on the other surface of the substrate 10. The electrodes 121a and 122a on the side of the terminal-use circuit component 121 and 122 not coupled to the substrate 10 are flush or substantially flush with the surface of the sealing resin 30b and exposed from the sealing resin 30b. The electrodes 121a and 122a exposed from the sealing resin 30b are each connected to ground. In addition, the electrodes 131a on both ends of the terminal-use circuit component 131 in the longitudinal direction are coupled to the wiring 10a.

It should be noted that the terminal-use circuit components 121, 122, and 131 preferably have, similarly to the terminal-use circuit component 21 described in Preferred Embodiment 1, for example, a pillar shape. The terminal-use circuit component 121 is provided, on the substrate 10, to be perpendicular or substantially perpendicular to the substrate 10. The terminal-use circuit component 121 is provided instead of a connection terminal 20 at the positions at which the connection terminal 20 is disposed. The same is true for the terminal-use circuit components 122 and 131.

It should be noted that the terminal-use circuit components 121, 122, and 131 may, similarly to the terminal-use circuit component 21 described in Preferred Embodiment 1, include conductive joining members (not shown), on the end surfaces of the electrodes 121a, 122a, and 131a, on the divided pieces of respective electrodes when the substrate and the respective terminal-use circuit components are coupled, or may include the conductive joining members and the hollow portion 44 or the through-hole 47, which are described in the Modifications 2 to 3 of the Preferred Embodiment 1. Further, corresponding to these, the conductive joining member, and the protruding portion 45 or the support rod 48 may be provided on the substrate 10 facing the terminal-use circuit components 121, 122, and 131. Thus, the terminal-use circuit components 121, 122, and 131 are disposed perpendicularly or substantially perpendicularly to the substrate 10.

With this configuration, regarding the circuit module 3 defining and functioning as a low pass filter, it is possible to reduce the size and improve the performance thereof.

It should be noted that the low pass filter defined by the terminal-use circuit components 121, 122, and 131 may be coupled to an antenna port that is coupled to an antenna to transmit and receive low frequency signals. For example, in the above-described circuit module 2a illustrated in FIG. 9, the low pass filter may be provided instead of the chip components 110 and 111. With this configuration, it is possible to reduce or prevent harmonics at multiple bands that are emitted from the antenna to transmit and receive low frequency signals. It should be noted that the harmonics include harmonics emitted from a power amplifier (not shown) and harmonics caused by the distortion at a duplexer, a switch, or other component. For example, in a case in which carrier aggregation is performed for Band 4 and Band 12, it is possible to reduce or prevent third harmonics of transmitting waves in Band 12 and thus reduce or prevent the deterioration of receive sensitivity in Band 4. Similarly, in a case in which carrier aggregation is performed for Band 1 and Band 28, by reducing or preventing third harmonics of transmitting waves in Band 28, it is possible to reduce or prevent the deterioration of receive sensitivity in Band 1.

It should be noted that, in a case of using an antenna to transmit and receiving high frequency signals, a high pass filter including the terminal-use circuit component described below may be coupled to an antenna port that is connected to the antenna to transmit and receive high frequency signals.

Furthermore, the low pass filter defined by the terminal-use circuit components 121, 122, and 131 is not limited to being coupled to a transmit port for low frequency signals but may be coupled to a transmit port for signals at a specific frequency. For example, in a case in which carrier aggregation is performed for Band 4 and Band 12 as described above, by coupling the low pass filter to a transmit port for Band 12, it is possible to reduce or prevent third harmonics of transmitting waves in Band and thus reduce or prevent the deterioration of receive sensitivity in Band 4.

Furthermore, the low pass filter defined by the terminal-use circuit components 121, 122, and 131 may be coupled to an antenna port to which a transmit port for signals at multiple frequencies is coupled. For example, in a configuration including Band 4, Band 12, Band 1, and Band 28, a transmit port for Band 12 and Band 28 may be coupled to a common terminal and the low pass filter may be coupled between the common terminal and an antenna port. In this case, as described above, in a case in which carrier aggregation is performed for Band 4 and Band 12, it is possible to reduce or prevent third harmonics of transmitting waves in Band 12 and thus reduce or prevent the deterioration of receive sensitivity in Band 4. Similarly, in a case in which carrier aggregation is performed for Band 1 and Band 28, by reducing or preventing third harmonics of transmitting waves in Band 28, it is possible to reduce or prevent the deterioration of receive sensitivity in Band 1. It should be noted that the case of using the high pass filter including the terminal-use circuit component described below is the same or substantially the same as the low pass filter case.

Preferred Embodiment 4

Figure 12A:
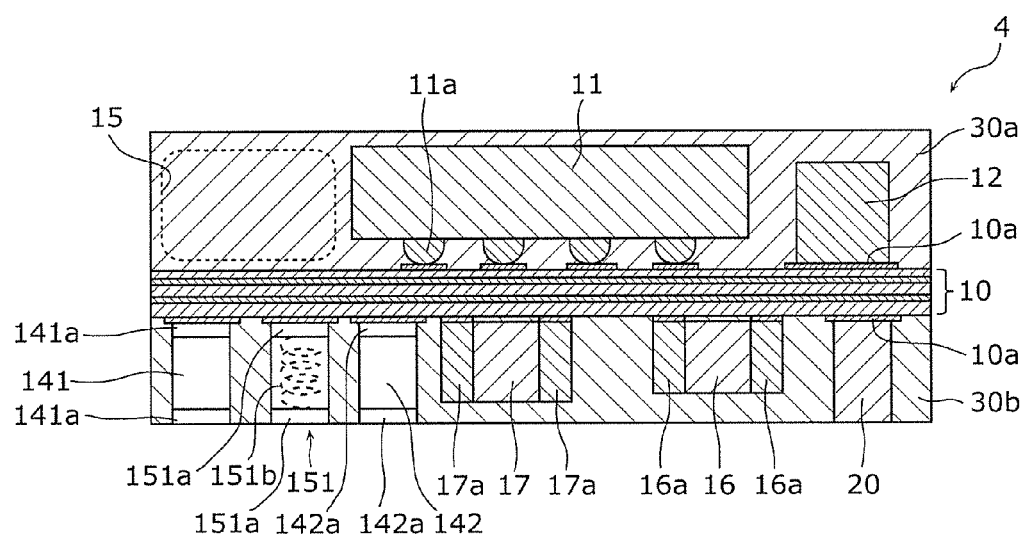
FIG. 12A illustrates a sectional view of a configuration of a circuit module according to a Preferred Embodiment 4 of the present invention.
Figure 12B:
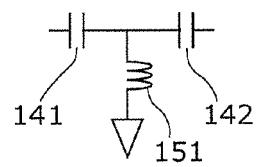
FIG. 12B is a circuit configuration diagram of a portion of the circuit module according to the Preferred Embodiment 4 of the present invention.

Next, a Preferred Embodiment 4 of the present invention is described with reference to FIGS. 12A and 12B. FIG. 12A illustrates a sectional view of a configuration of a circuit module 4 according to the present preferred embodiment. FIG. 12B is a circuit configuration diagram of a portion of the circuit module according to the present preferred embodiment.

The circuit module 4 according to the present preferred embodiment differs from the circuit module 1 according to the Preferred Embodiment 1 in that the circuit module 4 according to the present preferred embodiment includes three terminal-use circuit components that are disposed close to one another and that define a high pass filter. It should be noted that, regarding the same or substantially the same configuration as that of the circuit module 1 described in the Preferred Embodiment 1, the details are omitted in the following description.

As illustrated in FIG. 12A, the circuit module 4 is preferably, for example, a high-frequency circuit module. The IC chip 11, the coupler 12, and other components are disposed on one surface of the circuit module 4. In addition, the chip components 16 and 17, the connection terminal 20, and the terminal-use circuit components 141, 142, and 151 are disposed on the other surface of the circuit module 4. The terminal-use circuit components 141, 142, and 151 are disposed close to one another.

Further, the terminal-use circuit components 141 and 142 are preferably both capacitors, for example. The terminal-use circuit component 151 is preferably an inductor, for example. The terminal-use circuit component 151 is, as illustrated in FIG. 12A, disposed between the terminal-use circuit components 141 and 142. At the same time, as illustrated in FIG. 12B, the terminal-use circuit components 141 and 142 are connected in series and the terminal-use circuit component 151 is connected between ground and the node between the terminal-use circuit components 141 and 142. Thus, the terminal-use circuit components 141, 142, and 151 define and function as a high pass filter.

It should be noted that the terminal-use circuit components 141, 142, and 151 correspond respectively to a fourth capacitor, a fifth capacitor, and a fourth inductor of the present preferred embodiment.

The configuration of the terminal-use circuit components 141 and 142 is the same or substantially the same as that of the terminal-use circuit component 121 described in the Preferred Embodiment 3. Further, the configuration of the terminal-use circuit component 151 is the same or substantially the same as that of the terminal-use circuit component 21 described in the Preferred Embodiment 1 and includes electrodes 151a and a coil 151b.

Electrodes 141a and 142a provided at one end of the terminal-use circuit component 141 and one end of the terminal-use circuit component 142 in a longitudinal direction are each coupled to the wiring 10a provided on the other surface of the substrate 10. Electrodes 141a and 142a on the side of the terminal-use circuit component 141 and 142 not coupled to the substrate 10 are flush or substantially flush with the surface of the sealing resin 30b and exposed from the sealing resin 30b. The electrodes 141a and 142a exposed from the sealing resin 30b are each connected to, for example, another electronic component or another wiring. In addition, the electrodes 151a on both sides of the terminal-use circuit component 151 in a longitudinal direction are coupled to the wiring 10a between the terminal-use circuit components 141 and 142 that are coupled to the wiring 10a.

It should be noted that the terminal-use circuit components 141, 142, and 151 each preferably have, similarly to the terminal-use circuit component 21 described in Preferred Embodiment 1, for example, a pillar shape. The terminal-use circuit component 141 is provided on the substrate 10 to be perpendicular or substantially perpendicular to the substrate 10. The terminal-use circuit component 141 is provided instead of a connection terminal 20 at the positions at which the connection terminal 20 is disposed. It should be noted that the same is true for the terminal-use circuit components 142 and 151.

In addition, in the terminal-use circuit components 141, 142, and 151, similarly to the terminal-use circuit component 21 described in the Preferred Embodiment 1, the electrodes 141a, 142a, and 151a may each be divided into any number, for example, four, and conductive joining members (not shown) may be disposed, or may include the conductive joining member, and the hollow portion 44 or the through-hole 47, which are described in the Modifications 2 and 3 of the Preferred Embodiment 1. Further, corresponding to these, the conductive joining member, and the protruding portion 45 or the support rod 48 may be provided to the substrate 10 facing the terminal-use circuit components 141, 142, and 151. Thus, the terminal-use circuit components 141, 142, and 151 are disposed perpendicularly or substantially perpendicularly to the substrate 10.

With this configuration, the circuit module 4 defining and functioning as a high pass filter is reduced in size and has improved performance.

It should be noted that the present invention is not limited to the configurations described in the above-described preferred embodiments and various appropriate modifications may be made as, for example, modifications described below.

For example, the circuit module according to the above-described preferred embodiments may include an electronic component other than an IC, a duplexer, and a coupler. Moreover, the circuit module according to the above-described preferred embodiments may include a chip component other than a capacitor and an inductor.

Further, the terminal-use circuit component is not limited to an inductor, a capacitor, or the configuration in which an inductor and a capacitor are connected in parallel and may have another configuration.

Furthermore, the terminal-use circuit component is not limited to including the conductive joining members close to four corners thereof as described above and the conductive joining members may be disposed in any manner with the configuration in which an electrode of the terminal-use circuit component includes a void in a center portion thereof.

Moreover, the shape and the size of a hollow portion and the shape and the size of a through-hole that are provided in the terminal-use circuit component may be changed. Further, the shape and the size of a protruding portion and the shape and the size of a support rod, which are disposed on the substrate side to face a hollow portion or a through-hole, may be changed to any shape and any size that enable the protruding portion or the support rod to be inserted into the hollow portion or the through-hole.

In addition, the conductive joining member is not limited to being made of solder and may be made of another material. Furthermore, the protruding portion and the support rod are not limited to a metal and may be another material.

In addition, all configurations obtained by making to the above-described preferred embodiments and modifications that occur to those skilled in the art and all configurations including any combination of components and functions according to the above-described preferred embodiments and modifications without departing from the scope of the present invention are included within the present invention.

Preferred embodiments of the present invention are applicable to, for example, a circuit module in which an electronic component and other components are disposed on both surfaces of a substrate and sealed with a resin or a circuit device including the circuit module.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A circuit module comprising:
a substrate including first and second surfaces;
at least one electronic component mounted on each of the first and second surfaces;
a sealing resin sealing at least the at least one electronic component on the first and second surfaces of the substrate; and
a terminal-use circuit component defining a terminal at first and second ends of which electrodes are provided, one of the electrodes being joined by a conductive joining member to one of the first and second surfaces of the substrate such that an axis connecting centers of the electrodes at the first and second ends is perpendicular or substantially perpendicular to the substrate, and another of the electrodes being exposed at a surface of the sealing resin; wherein the terminal-use circuit component includes a void at which the conductive joining member is not disposed, at a center portion of the one of the electrodes on a side joined to the substrate.

2. The circuit module according to claim 1, wherein the void includes a hollow portion provided in the center portion of the one of the electrodes joined to the one of the first and second surfaces of the substrate; and the substrate includes a protruding portion at a position facing the hollow portion.

3. The circuit module according to claim 2, wherein the hollow portion includes a circular or substantially circular opening in the one of the electrodes on the side joined to the substrate.

4. The circuit module according to claim 3, wherein the hollow portion has a concave shape including a curved surface in a depth direction of the terminal-use circuit component.

5. The circuit module according to claim 4, wherein the protruding portion has a convex shape including a curved surface identical or substantially identical in shape to the curved surface of the hollow portion.

6. The circuit module according to claim 3, wherein the protruding portion has a circular or substantially circular shape identical or substantially identical to the circular or substantially circular opening.

7. The circuit module according to claim 2, wherein the hollow portion includes a through-hole passing through the first and second ends of the terminal-use circuit component; and the protruding portion includes a support rod that passes through the through-hole.

8. The circuit module according to claim 1, further comprising:

a low pass filter; wherein the low pass filter includes:

a first capacitor;

a third inductor one end of which is connected to one end of the first capacitor and another end of which is connected to another end of the first capacitor;

a second capacitor connected between ground and a node between the one end of the first capacitor and the one end of the third inductor; and a third capacitor connected between ground and a node between the another end of the first capacitor and the another end of the third inductor.

9. The circuit module according to claim 8, wherein the third capacitor is disposed between the electrodes at the first and second ends of the terminal-use circuit component; and the third inductor includes a coil wound around the third capacitor.

10. The circuit module according to claim 8, wherein the low pass filter is coupled to an antenna port that is coupled to an antenna to transmit and receive a low frequency signal.

11. The circuit module according to claim 8, wherein the low pass filter is coupled to an antenna port to which a transmit port to transmit signals at multiple frequencies is coupled.

12. The circuit module according to claim 1, wherein the at least one electronic component includes an IC chip, a coupler, duplexers, and chip components disposed on the first surface of the substrate and chip components and connection terminals provided on the second surface of the substrate.

13. The circuit module according to claim 12, wherein the chip components on the first surface of the substrate include at least one of capacitor, an inductor, and a resistor.

14. The circuit module according to claim 12, wherein the chip components on the second surface of the substrate include at least one of capacitor, an inductor, and a resistor.

15. The circuit module according to claim 1, wherein the terminal-use circuit component has a pillar shape.

16. The circuit module according to claim 15, wherein the terminal-use circuit component has dimensions of about 0.2 mm×about 0.2 mm×about 0.4 mm.

17. The circuit module according to claim 1, wherein the one of the electrodes is divided into a plurality of portions around the void.

18. The circuit module according to claim 1, wherein a surface acoustic wave filter is disposed on the substrate;

the terminal-use circuit component includes a first inductor provided between ground and a path on one side of an input side and an output side of the surface acoustic wave filter and a second inductor connected between ground and a resonator of the surface acoustic wave filter, the resonator being provided between ground and a path on another side of the input side and the output side of the surface acoustic wave filter; and the first inductor and the second inductor are disposed adjacent to each other.

19. The circuit module according to claim 1, further comprising:

a high pass filter; wherein the high pass filter includes:

a fourth capacitor and a fifth capacitor that are connected in series; and a fourth inductor connected between ground and a node between the fourth capacitor and the fifth capacitor.

20. The circuit module according to claim 1, wherein the substrate is a Low Temperature Co-Fired Ceramics substrate.

* * * * *